US006604227B1

(12) United States Patent
Foltin et al.

(10) Patent No.: US 6,604,227 B1
(45) Date of Patent: Aug. 5, 2003

(54) MINIMAL LEVEL SENSITIVE TIMING ABSTRACTION MODEL CAPABLE OF BEING USED IN GENERAL STATIC TIMING ANALYSIS TOOLS

(75) Inventors: Martin Foltin, Fort Collins, CO (US); Brian Foutz, Ithaca, NY (US); Sean Tyler, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 28 days.

(21) Appl. No.: 09/928,161

(22) Filed: Aug. 10, 2001

(51) Int. Cl.[7] ................................................ G06F 17/50
(52) U.S. Cl. ............................................ 716/6; 716/18
(58) Field of Search ...................... 716/1–6, 18; 703/19

(56) References Cited

U.S. PATENT DOCUMENTS 4,924,430 A * 5/1990 Zasio et al. .................... 716/6
5,475,607 A * 12/1995 Apte et al. .................... 716/10
5,651,012 A * 7/1997 Jones, Jr. .................... 714/724
5,740,347 A 4/1998 Avidan .................. 395/183.09
5,796,985 A 8/1998 O'Brien et al. ............. 395/500
5,946,475 A 8/1999 Burks et al. ........... 395/500.07
6,023,568 A * 2/2000 Segal ............................ 716/6
6,430,731 B1 * 8/2002 Lee et al. ...................... 716/6

* cited by examiner

*Primary Examiner*—Vuthe Siek
*Assistant Examiner*—Paul Dinh

(57) ABSTRACT

A minimal level sensitive timing abstraction model supports multiple levels of hierarchy, is input stimulus independent, can be input into general static timing analysis (STA) tools, and limits timing analysis to the most critical paths, i.e., the most critical arrival at any given port, leading to significant reduction of the number of internal clock-controlled nodes, which in turn results in significant speed-up of STA runs on large circuits and reduced memory and storage space requirements. Further speed-up of STA runs may be achieved by tracing only the most relevant transparent paths to a given output port, which reduces the number of paths fed to the adjacent blocks. The timing abstraction model may also simplify the output from the timing analysis and may shorten designer's time to analyze STA results.

19 Claims, 9 Drawing Sheets

MINIMAL LEVEL SENSITIVE TIMING ABSTRACTION MODEL CAPABLE OF BEING USED IN GENERAL STATIC TIMING ANALYSIS TOOLS

CROSS-REFERENCE TO RELATED PATENT APPLICATIONS

This application is related to commonly assigned U.S. patent application Ser. No. 09/927,856, entitled "A Minimal Level Sensitive Timing Representative of a Circuit Path;" U.S. patent application Ser. No. 09/927,220, entitled "Modeling Circuit Environmental Sensitivity of a Minimal Level Sensitive Timing Abstraction Model;" U.S. patent application Ser. No. 09/927,857, entitled "Improved Load Sensitivity Modeling in a Minimal Level Sensitive Timing Abstraction Model;" and U.S. patent application Ser. No. 09/927,204, entitled "Enabling Verification of a Minimal Level Sensitive Timing Abstraction Model."

TECHNICAL FIELD

The technical field relates to timing analysis systems, and, in particular, to static timing analysis of a digital circuit.

BACKGROUND

A wide variety of design verification tools are required to produce a working integrated circuit from a functional specification. These tools analyze different parameters of a circuit design to insure that the circuit will function properly after the circuit is fabricated. One important set of verification tools includes timing analysis tools, which are widely used to predict the performance of very large scale integrated (VLSI) designs. Often, timing analysis determines the best path for a designer to pursue or helps to optimize the overall circuit design. In digital circuits, timing considerations can be critical to proper performance. Timing analysis tools may be either static or dynamic.

Dynamic timing analysis (DTA) tools provide the most detailed and accurate information obtainable concerning the performance of a circuit. With DTA, a design engineer must provide sets of waveforms to simulate the conditions under which a circuit will operate. This type of timing analysis is often generated through simulation of a circuit by simulation programs that operate at the transistor level. Examples of such circuit simulation programs are SPICE by University of California at Berkeley and ASTAP by IBM Corporation. For more information on SPICE, refer to "SPICE2: A Computer Program to Simulate Semiconductor Circuits," by L. W. Nagel, Technical Report ERL-M520, UC-Berkeley, May 1975. These DTA programs typically operate by solving matrix equations relating to the circuit parameters, such as voltages, currents, resistances and capacitances. Additionally, such circuit simulation approaches to performance analysis are pattern-dependent, or stated another way, the possible paths and the delays associated with the paths depend upon a state of a controlling mechanism or machine of the circuit being simulated. Thus, the result of a DTA depends on the particular test pattern, or vector, applied to the circuit.

While such circuit simulation programs and DTA tools provide high accuracy, long simulation times are required because a large number of patterns must be simulated since the best and worst case patterns are not known before the simulation occurs. The number of simulations which must be performed is proportional to $2^n$, where "n" is a number of inputs to the circuit being simulated. Thus, for circuits having a large number of inputs, DTA is not always practical.

Static timing analysis (STA) tools are also widely used to predict the performance of VLSI designs. In STA, a design engineer applies signal arrival and departure times only at each block input, not at base waveform. Additionally, each signal is assumed to switch independently in each machine cycle, i.e., static timing analyzer is waveform independent and simulates the most critical arrival time at each node in the circuit.

In STA, since only the best and worst possible rising and falling times are computed for each signal in the circuit, such times are typically determined in a single pass through a topologically-sorted circuit. When referring to a topologically-sorted circuit, a signal time associated with each subcircuit of the circuit being tested is determined in a sequential nature. Therefore, the signal time associated with a first subcircuit whose output will be propagated to a second subcircuit must be determined before the signal time associated with the second subcircuit is calculated. Typical static analysis methods are described in "Timing Analysis of Computer Hardware," by Robert B. Hitchcock, Sr., et al., IBM J. Res. Develop., Vol. 26, No. 1, pp. 100–105 (1982).

Timing models used in timing analysis are blocks of computer data that can be used to recreate the timing behavior of an electronic circuit. The size of timing models should be as small as possible for a given complexity of circuit, while maintaining the accuracy of the timing model. In general, a smaller timing model will not only require less space in a computer memory, but also will be faster for a computer to evaluate. Often, timing model accuracy is sacrificed to shrink the timing model and speed its evaluation. This is especially important for large timing models that represent an entire subcircuit of an electronic system.

A popular technique for shrinking a timing model involves creating port-based timing models as opposed to path-based timing models. Port-based timing models analyze an electronic circuit to isolate and maintain only the timing behavior that can be observed at the circuit's connections, often referred to as ports, to surrounding circuits. Any timing behavior of a circuit that is internal to the circuit is discarded, leaving only the information that is essential to verifying the timing behavior of the circuit in the context of surrounding circuits. The port-based timing models have been used in both timing simulation and STA. The timing models are accurate, and generally provide good compression of timing model size.

In port-based timing modeling, the electronic circuit is analyzed to determine the longest time for an electronic signal to pass from each input port to each output port. Often the shortest time is determined as well. An edge triggered latch in the circuit, controlled by a clock signal, acts much like an internal port and is also considered a start point and an end point for electronic signals. At the instant the value of its clock signal changes, the edge triggered latch passes the value of its data signal to its output signal. At other times, the edge triggered latch holds the value of its output signal constant. Analysis is also done to determine the longest time for an electronic signal to pass from each input port to the input signals of each edge triggered latch and from the output signal of each edge triggered latch to each output port.

In true port-based timing models, the internal latch nodes are abstracted away and only the longest time for an electronic signal to arrive at each given output port is calculated. Often the shortest time is calculated as well. The latest (and often also the earliest) allowed time for signal to arrive at each given input port is also calculated. For circuits with edge triggered latches, these calculations are rather simple. The longest time for a signal to arrive at the output port is the time when the clock signal changes on the edge triggered latch that is connected to the output port by a combinational circuitry, plus the time the signal passes from the latch to the output port. If more edge triggered latches are connected to the output port by a combinational circuitry, the latest signal arrival from all the latches is considered. The latest allowed time for the signal to arrive at the input port is the time when the clock signal changes on the edge triggered latch that is connected to the input port by a combinational circuitry, minus the time the signal passes from the input port to the latch, minus the setup time for the latch (due to the physical characteristics of the latch electronic circuitry, the signal value at the latch input must be stable before the clock signal changes). If more latches are connected to the input port by a combinational circuitry, the latest time for the signal to arrive at the input port is the minimum from the latest times determined for the individual latches as described above. The latch that determines the minimum time is referred to as the most critical latch. PathMill's Black box timing model supports these calculations. However, the calculations become more complicated for circuits that use level triggered latches, and PathMill's Black box cannot accurately model such circuits.

Many digital circuits use level triggered latches, i.e., transparent latches, in place of edge triggered latches. Like an edge triggered latch, a level triggered latch is controlled by a clock signal. The edge triggered latches are active only at the instant the clock signal changes, while the level triggered latches can be active at any time that the clock signal remains at a specified voltage (high or low voltage).

The level triggered latches in a circuit can time borrow amongst themselves. Time borrowing is possible when the combinational logic between two latches requires more time than the clock phase to compute a stable value. However, if the logic following the second latch requires less than an entire clock phase to compute a stable value, then the value propagated by the first latch need not become stable until some time after the second latch becomes active. The second set of logic will still have enough time to propagate a stable value, even though the calculations did not begin until some time after the latches become active. Time borrowing is an essential technique for latch-based design. High performance or custom designed circuits, such as modern CPUs, rely on level triggered latches to take advantage of the time borrowing that helps reach high clock frequencies. Timing models that do not support time borrowing are inadequate for such designs.

When the clock signal transitions to inactivate the latch, the level triggered latch latches the input data and holds that value on the output port until the clock transitions again. The input data is fed to the level triggered latch via the latch's data pin. The output of the latch is available on the latch's output pin. The clock signal is connected to the latch using the latch's clock pin.

Due to the physical characteristics of the electronic circuitry from which physical latches are implemented, the transition between when the latch is transparent and when the latch holds its value is not instantaneous. Therefore, the value on the data pin must be available a certain amount of time before the clock signal transitions to a low voltage. This time is called the setup time. Routines that verify that the data is available early enough to meet the setup time are called setup checks and violations are called setup violations. In addition to the setup time, the data value must remain constant for a certain amount of time after the clock transitions to low. This time is called the hold time. Routines that verify that the data is available long enough to meet the hold time are called hold checks and violations are called hold violations. If a setup or a hold violation occurs, the latch might not contain a valid value. Thus, it is important that timing models accurately represent setup and hold times.

In a timing model block for a circuit, a signal arriving at the output ports depends on the signal arrival time at the input ports, referred to as stimulus. In a stimulus dependent timing model, the parameters of the timing model are limited to certain intervals of the arrival times. If the stimulus is outside of the interval, the timing model does not properly represent the circuit and the model needs to be rebuilt each time when the stimulus change. In a stimulus independent timing model, the timing model works irrespective of when the signal arrives at the input ports, i.e., always generating correct arrival at the output port.

Currently available timing models that can be input into general STA tools fall into three categories. PathMill's conventional Black box timing models are port-based and stimulus independent. However, the conventional Black box timing models do not support transparency. PathMill's new transparent Black box timing models are port-based with limited support of transparency. However, the new Transparent Black box timing models are stimulus dependent. PathMill's Gray box timing models support transparency and are stimulus independent. However, the Gray box timing models are not port-based.

For circuits with level triggered latches, the Transparent Black box timing models are significant improvement over the conventional Black box timing models. The latest allowed time for the signal to arrive at a given input port, i.e., the time before setup violation occurs, is calculated, considering not only the first latch connected to the given input port by a combinational circuitry. The second latch or other sequential element that is connected to the first latch by a combinational circuitry is also considered, as well as the third and any successive latch that may be on a transparent path from the given input port. Considering all latches is important because, in circuits with transparent latches, the second, third, or other latch on the transparent path from an input port may be more critical than the first latch, i.e., the second, third, or other latch determines the latest time on the input port before the setup violation occurs, employing similar calculation procedure as described earlier for the first latch in the conventional Black box timing model. Similarly, the longest time for an electronic signal to arrive at the output port is calculated, considering not only the last latch connected to the output port by a combinational circuitry, but also the previous latch that is connected to the last latch by a combinational circuitry, as well as any earlier latch that may be on a transparent path to the output port.

However, in the Transparent Black box timing model, the signal arrival at the output port on a transparent path is correct only for the input port stimulus that was used to build the model. When the input stimulus changes, the model needs to be rebuilt or the signal arrivals at output ports on transparent paths may be wrong, since the Black box timing model cannot represent the unique clock-controlled connectivity between the input and the output ports on a transparent path. Instead, the output signal arrival time on the most critical transparent path is hard-coded in the model, which makes the model valid only for a particular input stimulus.

PathMill's Gray box timing models support transparency and are stimulus independent. However, Gray box timing models abstract only combinational circuit elements and retain all sequential elements that are represented by internal clock-controlled nodes connected by time-arcs, i.e., not port-based. For blocks with a large number of latches, Gray box timing models have a large number of internal nodes and time-arcs, resulting in a large number of timing checks to be performed and a large number of paths to be traced in a STA run. All timing checks carried out on a lower level of hierarchy need to be repeated again on higher hierarchy levels, because no sequential nodes are abstracted away when moving from one level of hierarchy to the next level. As a result, the large number of timing checks leads to long STA runtimes and large memory requirements, especially on higher hierarchy levels and full chip levels, which, in turn, results in slow roll-up/roll-down times and a need to manually simplify the timing model so that the STA on larger blocks does not run out of memory.

SUMMARY

A method for modeling a circuit block with a minimal level sensitive timing abstraction model includes extracting a plurality of parameters from a circuit that includes sequential elements, such as latches or domino logic, controlled by clock elements and creating an echo-circuit that represents the plurality of parameters. The echo-circuit is lightweight and can be input into any static timing analysis (STA) tools.

The extracted parameters are modeled by circuit elements in the echo-circuit as follows. A required time parameter, which represents the latest/earliest time a signal can arrive at a given input port before a setup/hold violation occurs on a circuit element in the modeled circuit, is modeled in the echo-circuit by a setup/hold check node attached to a corresponding input port. A valid time parameter, which represents the latest time a signal from any clock element in the modeled circuit arrives at the output port, is modeled in the echo-circuit by a derived clock node that controls a dummy latch node attached to a corresponding output port. An input-to-output delay parameter, which represents a time delay a signal passes from the input port to the output port on a path through transparent latches in the modeled circuit, is modeled in the echo-circuit by a time-arc (or by a net with delay) that connects the setup/hold check node attached to the input port and the dummy latch node attached to the output port. An input-to-output delay parameter, that represents a time delay a signal passes from the input port to the output port on a combinational path in the modeled circuit, is modeled in the echo-circuit by a time-arc (or by a net with delay) that connects the input port and the output port.

The dummy latch node enables the signal in the timing abstraction model to propagate from the input port to the output port only if the signal arrives at the output port later than a clock signal from the most critical clock element associated with that output port, i.e., the clock element from which signal in the modeled circuit arrives at the output port at the latest time.

In an embodiment, the setup/hold check node may be replaced by a latch node, denoted as setup/hold check latch, to assure proper cycle count advancement on a transparent path going from a given input port to a given output port. In another embodiment, more than one setup/hold check (or latch) node may need to be attached to each input port and more than one dummy latch node may need to be attached to each output port in circuits where the clock signals are derived from multiple reference clocks or from different phases of the same reference clock.

The timing abstraction model supports multiple levels of hierarchy and limits timing analysis to the most critical paths, i.e., a path from the input port to the setup/hold check node, a path from the input port to the dummy latch node, a transparent path between the input port and the output port, and a path between the most critical clock element and the output port, leading to significant reduction of the number of internal clock-controlled nodes, which in turn results in significant speed-up of STA runs on large circuits and reduced memory and storage space requirements. The number of internal nodes in the timing abstraction model scales with number of ports rather than with number of paths. For most circuits, the number of timing checks to be performed is limited to one check per each input port plus one check per each input port-output port pair that is connected by a transparent path for at least one input stimulus. Further speed-up of STA runs is achieved by tracing only the most relevant transparent paths to a given output port, i.e., only those paths on which signal arrives at the output port later than the latest clock signal, which reduces the number of paths fed to the adjacent blocks. The timing abstraction model also simplifies the output from the timing analysis and may shorten designer's time to analyze STA results.

DESCRIPTION OF THE DRAWINGS

The preferred embodiments of a minimal level sensitive timing abstraction will be described in detail with reference to the following figures, in which like numerals refer to like elements, and wherein.

DETAILED DESCRIPTION

Figure 1:
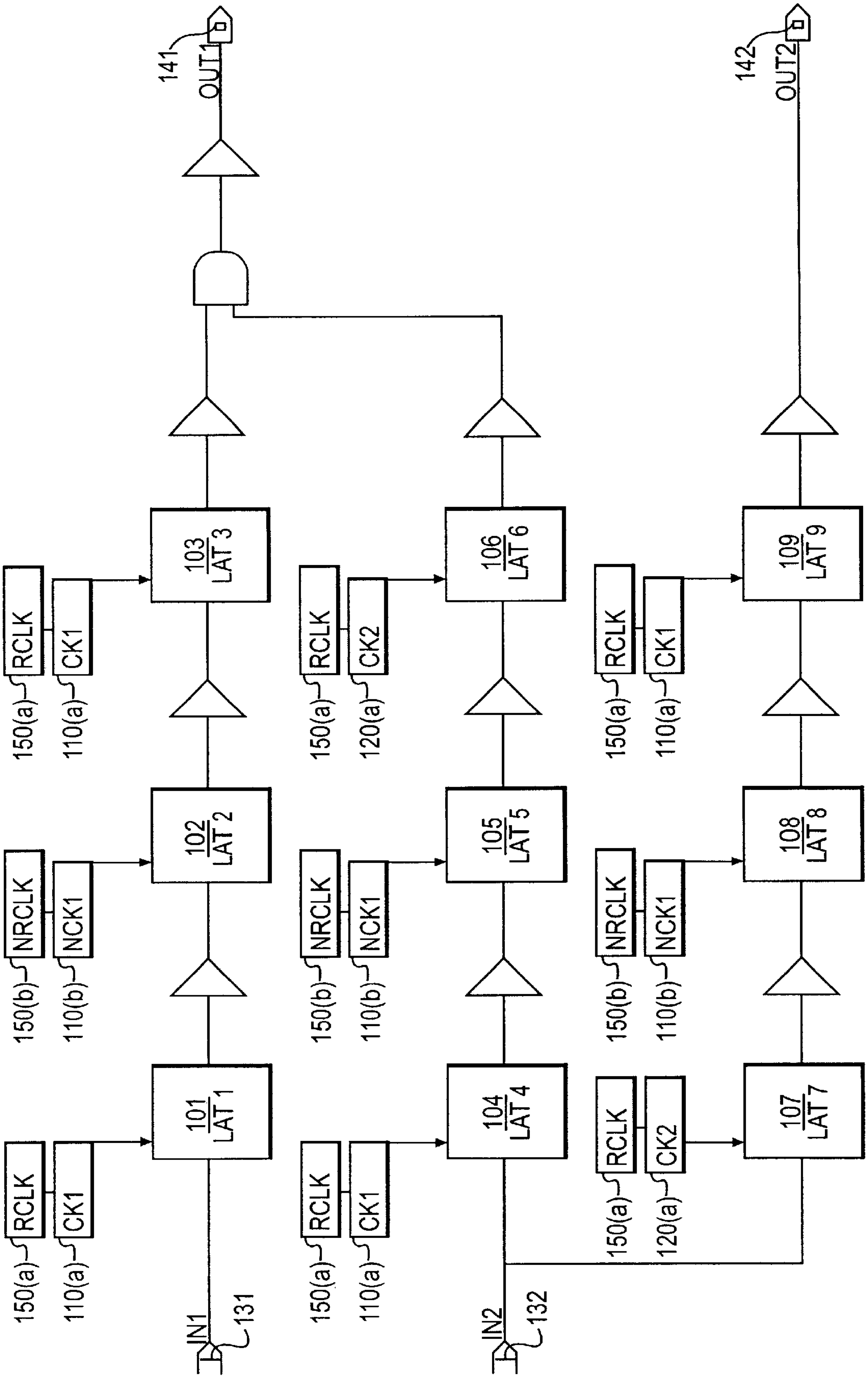
FIG. 1 is an exemplary circuit block with two input ports, two output ports, and three transparent paths IN1-OUT1, IN2-OUT1, and IN2-OUT2, wherein on each transparent path the first and the last sequential elements are controlled by the same reference clocks.

A minimal level sensitive timing abstraction model provides for a minimal representation of a digital circuit block, in the form of an equivalent circuit or connectivity network, with a minimum number of internal nodes. The timing abstraction model supports transparency, is stimulus independent, and can be input into general static timing analysis (STA) tools to efficiently perform timing analysis on large circuits that contain the modeled circuit block. The circuit block represented by the timing abstraction model may contain a combination of sequential and combinational elements, as well as one or more blocks that are themselves this type of timing abstraction model.

The timing abstraction model supports multiple levels of hierarchy and limits timing analysis to most critical paths, i.e., a path from an input port to a setup/hold check node, a path from the input port to a dummy latch node that checks for transparency, a transparent path between the input port and an output port, and a path between a most critical clock element and the output port. The limitation of timing analysis to the most critical paths leads to a significant reduction of the number of internal clock-controlled nodes, which in turn results in significant speed-up of STA runs on large circuits and reduced memory and storage space requirements. Further speed-up of STA runs is achieved by tracing only the most relevant transparent paths to a given output port, i.e., only the paths on which the signal arrives at the output port later than the clock signal from the most critical clock element, which reduces the number of paths fed to the adjacent blocks. The timing abstraction model also simplifies the output from the timing analysis and may shorten a designer's time to analyze STA results.

The purpose of the timing analysis is to simulate signal arrival times at different nodes in a digital circuit to assure proper functionality of the circuit. Within the circuit are clock-controlled nodes and nodes that are not controlled by clocks. On the clock-controlled nodes, the signal must arrive within a certain time interval relative to the clock. For example, for an edge triggered latch, the signal must arrive at the latch before the active edge of the clock, and for a level triggered latch, the signal must arrive before the closing edge of the clock, i.e., while the latch is open or in an active level. If the signal does not arrive within this timing interval, a violation occurs and the circuit may not function properly. Timing analysis is a computer simulation of the digital circuit to simulate arrival times on the clock-controlled nodes and to verify that the signal arrives at the nodes within the allowed time interval.

A micro chip containing digital circuits may have millions of elements, such as transistors, gates, resistors, and interconnects represented by resistors and capacitors. Simulation and timing analysis on a full chip level is expensive. Accordingly, a common practice is to divide the chip into blocks and conduct timing analysis on each of the blocks individually. The blocks are given the characteristics of the real circuit, by abstracting away unnecessary information from the circuit and characterizing the circuit by a set of useful parameters.

Port-based timing models involve less timing simulation than path-based timing models. In port-based timing models, the number of nodes scales with the number of ports. In path-based timing models, the number of nodes scales with the number of paths, which is significantly more than the number of ports in a circuit. The more nodes there are, the longer the timing checks take. So the number of nodes determines how fast the timing checks are performed. In an embodiment of the timing abstraction model, which is port-based rather than path-based, the number of timing checks to be performed, i.e., the number of parameters, scales with the number of input ports plus the number of input-to-output port pairs that are connected by transparent paths for at least one input stimulus, which is usually much less than the total number of paths in the circuit.

Accordingly, the speed-up of STA runs that uses the timing abstraction model may be achieved as follows. First, the number of timing checks to be performed in most circuits may be reduced to one check for each input port plus one check for each input-to-output port pair that is connected by a transparent path for at least one input stimulus. Second, each timing check may be performed faster in the port-based timing model than in a path-based timing model, because the number of clock controlled internal nodes in the port-based model is small, i.e., in most circuits the number of clock controlled nodes is equal to number of ports. Therefore, a larger part of this port-based model may be stored in the fast computer memory, i.e., the main memory or the very fast microprocessor cache memory, than in the path-based timing models. Third, only the most relevant transparent paths, i.e., paths on which a signal arrives at the output port later than the latest clock signal, are traced to a given output port, reducing the number of paths fed to the adjacent blocks.

Level triggered latches, which support transparency, can be active when any of their clock signals, i.e., clock elements, remain at a high voltage, while edge triggered latches are active only at the instant the clock signals change. Some level triggered latches are active when the clock signals are at low voltage, instead of high voltage, but the processes are the same. The timing abstraction model has level triggered latches. In the discussion that follows, level triggered latches are transparent when the clock signals are high, but as will be apparent to one skilled in the art, the techniques described also apply to latches that pass values when the clock signals are low. Also, the following paragraphs describe modeling of maximum (long) path STAs, i.e., the paths with the latest signal arrival at input and output ports. As will be apparent to one skilled in the art, the techniques described also apply to minimum (short) path STAs, i.e., the paths with the earliest signal arrival at the input and output ports, except that there are no short transparent paths in the circuit.

An embodiment of the timing abstraction model first extracts a minimal set of characteristics, i.e., parameters, from the modeled circuit in order to simulate timing on the circuit. The parameters include: 1) a required time parameter associated with an input port, i.e., the latest time a signal can arrive at the input port before a setup violation would occur in the modeled circuit on some sequential element, i.e., a latch or a domino logic, connected to the input port by a combinational circuitry and/or a circuitry that consists of one or more transparent sequential elements; 2) a valid time parameter associated with an output port, i.e., the latest time the signal from any clock element arrives at the output port; and 3) an input-to-output delay parameter that represents a time delay a signal passes from the input to the output port on a transparent path.

Next, the timing abstraction model creates an echo-circuit that represents the characteristics and can be input into virtually any STA tool. The echo-circuit may be a timing abstraction model represented in PathMill's Gray box format.

The first characteristic to be extracted is a setup/hold check time, referred to as a required time, associated with a setup/hold check node at each input port in the timing abstraction model. Associating timing checks with the input port do not reduce the universality of the timing abstraction model because STA analysis tools support circuits with setup/hold timing checks attached to any node.

STA uses two different simulations. A simulation for maximum paths, i.e., the setup check, determines the latest time a data signal can arrive at the input port before any violation in the modeled circuit will occur. A simulation for minimal paths, i.e., the hold check, determines if the data signal is stable for a long enough time at the input port. The following paragraphs describe the simulation with respect to the maximum path. However, one skilled in the art should appreciate that the minimal path simulation behaves in a similar fashion, except that there are no transparencies in minimal path simulation because there is no input-to-output path.

As described above, the setup check node checks data arrival at the input port with respect to the required time, which is the latest time the data signal can arrive at the input port before any violation would occur in the modeled circuit. In other words, the setup check node checks if the data signal arrives at the input port early enough so that the most critical clock-controlled node of the modeled circuit, i.e., the most critical latch or other sequential element such as the domino logic, will have no violation. The most critical sequential element in the modeled circuit is the sequential element on which the violation occurs with the earliest time arrival at the input port. The most critical path is the one that fails first, and the setup check node checks the required time that corresponds to the time when the failure occurs on the most critical sequential element.

As an example, a circuit with three latches may have the most critical as the second latch. In this example, 800 picoseconds may be required for a signal to propagate from the input port to the second latch, and the signal may be required to be at the second latch at time 1000 picoseconds or earlier. If the signal arrives at the second latch in the modeled circuit at 1000 picoseconds, which is the latest allowed time, there is no violation. On the other hand, if the signal arrives at 1001 picoseconds, a violation occurs. Since 800 picoseconds are required to propagate the signal from the input port to the second latch, the signal must arrive at the input port within 200 picoseconds.

In general, the setup time, SI, at an input port I can be expressed as:

$$SI = \min_{J}(SI_j) \tag{1}$$

$$SI_j = SL_j + (\text{Cycle}_j - \text{Cycle}_0)T - \text{Delay}_j \tag{2}$$

where $SI_j$ is the latest time a signal can arrive at the input port I before violation would occur on a sequential element, i.e., latch or domino logic, $L_j$ in the modeled circuit, $SL_j$ is the latest time signal can arrive at the sequential element $L_j$ before setup violation would occur on the sequential element, $\text{Cycle}_j$ is the clock cycle count on the sequential element $L_j$, $\text{Cycle}_0$ is the cycle count on input I (usually $\text{Cycle}_0=1$), T is the clock cycle time (the clock period) and $\text{Delay}_j$ is the time the signal needs to propagate from the input port I to the sequential element $L_j$.

The setup times $SI_j$ can be obtained, for example, from a Pathmill run with a late stimulus at the input port I and a latch_error_recovery feature turned on. The late stimulus is an arbitrarily chosen stimulus, Lstim, that is so late that with a certainty a setup violation will occur on some sequential element in the circuit (usually, Lstim can be any number that is much higher than the clock period T). Then, the setup time $SI_j$ can be expressed as:

$$SI_j = Lstim - \sum_{k=1}^{j-1} Advance_k + Slack_j, \tag{3}$$

where $\text{Slack}_j$ is the timing slack on the sequential element $L_j$, and $\text{Advance}_k$ is the timing adjustment introduced by the latch_error_recovery feature on the sequential element $L_k$ that is on the path from the input port I to the sequential element $L_j$.

The setup times, $SI_j$, can be obtained from other commercial STA tools in a similar way. For example, the setup times can also be obtained directly from Pathmill's Transparent Black model, if the signal arrival times at output ports are not subjected to any constraints when such model is generated.

The second characteristic to be extracted is an opening time, referred to as a valid time, associated with a dummy latch node attached to each output port. The dummy latch node may be controlled by a derived clock that has an opening edge offset with respect to the opening edge of a clock port. The derived clock typically becomes active at the time corresponding to the latest signal arrival from the clock port to the output port in the modeled circuit. The dummy latch node compares data signal arrival at the output port with the clock signal arrival of the latest clock at the output port. All paths arriving before the latest clock stop at the dummy latch node, i.e., the paths are not transparent and the clock signal goes to the output port instead. If the data signal arrives after the clock signal, the data signal propagates to the output port.

Multiple paths may converge from multiple input ports to one output port, with each path controlled by a different clock. In the timing abstraction model, the dummy latch node enables comparison of the data signal with the latest clock signal. Accordingly, the data signal may be blocked if the signal arrives earlier than any of the clocks converging to the output port. Comparing the paths with the most critical clock significantly reduces the number of paths that arrive at the output port.

In general, the valid time, VO, at an output port O can be expressed as:

$$VO = \max_{J}(VO_J) \tag{4}$$

$$VO_j = DO_j - (\text{Cycle}_j - 1)T \tag{5}$$

$$DO_j = DC_j + \text{Delay}_j, \tag{6}$$

where $DO_j$ is the signal arrival time at the output port O from clock port $C_j$, $DC_j$ is the signal arrival at a clock port $C_j$, $\text{Delay}_j$ is the time the signal needs to propagate from the clock port $C_j$ to the output port O, $VO_j$ is the time $DO_j$ adjusted to the first clock cycle, $\text{Cycle}_j$ is the clock cycle count on the output port O and T is the clock cycle time (the clock period). Note that the valid time VO calculated from equations (4)–(6) is adjusted to be in the first clock cycle. The offset between the clock port $C_j$ and the derived clock controlling the dummy latch node will be set to time $VO-DC_j$. The STA tool will determine whether or not the input signal will pass the dummy latch node in the timing abstraction model based on the valid time and the cycle count on the path from the input port.

The most critical path from the clock port to the output port O will have a delay $\text{Delay}_{jmax}=DO_{jmax}-DC_{jmax}$, where $DO_{jmax}$ is the signal arrival time at the output port O from the most critical clock port $C_{jmax}$that determines the valid time according to equation (4).

The clock signal arrival times, $DO_j$, and the clock cycle counts, $Cycle_j$, can be obtained from any commercial STA tool, such as Pathmill. The clock signal arrival times and the clock cycle counts are stimulus independent because the clock signal propagation is independent on input signal arrival times.

The third characteristic to be extracted is an input-to-output delay, i.e., transparent delay arc. The delay exists only if, for some stimulus, the signal propagates transparently between the input port and the output port. The dummy latch node opens at the valid time and closes at the latest possible signal arrival time from an input port that has a timing path to the output port. Such time is determined by the required times and the path delays. Accordingly, the dummy latch node enables a signal to propagate from the input port to the output port only if the signal arrives at the output port later than a clock signal on the most critical clock controlling the dummy latch node. This feature is acceptable for STA tools because STA only deals with the most critical path, i.e., the most critical arrival at any given node.

Therefore, all inputs that arrive at the output port before the latest clock are blocked by the dummy latch node and will not propagate to the next block. The blocking of early arrived inputs simplifies output from the timing analysis because only the most relevant transparent paths are considered. More importantly, the timing abstraction model reduces the number of paths fed to the adjacent blocks and speeds-up the STA runs, because, by blocking the number of paths that leave the first block, the total number of paths in the circuit may be decreased significantly. In addition, by limiting timing analysis to the most critical paths, the timing abstraction model simplifies the output from the timing analysis and shortens designer's time to analyze STA results because only the paths that are important are printed in the report.

The input-to-output delays can be obtained from any commercial STA tool, such as Pathmill, when the input stimulus is set to the required time, SI, described above. These characteristics, i.e., the required time, the valid time, and the input-to-output delay, may be obtained from STA analysis as discussed above. Compared with PathMill's Black box and Transparent Black box timing models, the timing abstraction model described above represents each input-to-output transparent path by an equivalent circuit that consists of time-arcs (or connectivity networks) and clock-controlled (dummy latch) nodes to model signal arrivals at the output ports independently on input stimulus. The equivalent circuit may be designed such that the tracing of false non-transparent paths is avoided and the reported transparent paths are limited to those critical paths that may be important for the designer. In other words, the timing abstraction model is input-stimulus independent and needs to be rebuilt only when the clock waveforms change.

FIG. 1 is an exemplary circuit block with input ports $IN_1$ 131 and $IN_2$ 132, output ports $OUT_1$ 141 and $OUT_2$ 142, and timing paths $IN_1$-$OUT_1$, $_{IN2}$-$OUT_1$, and $IN_2$-$OUT_2$. Nine latches are shown in the exemplary circuit. Latches $LAT_1$ 101, $LAT_2$ 102, and $LAT_3$103 are sequentially connected on the $IN_1$-$OUT_1$ path. Latches $LAT_4$ 104, $LAT_5$ 105, and $LAT_6$ 106 are on the $IN_2$-$OUT_2$ path. Latches $LAT_7$ 107, $LAT_8$ 108, and $LAT_9$ 109 are on the $IN_2$-$OUT_2$ path.

The latches $LAT_1$ 101, $LAT_3$ 103, $LAT_4$ 104, and $LAT_9$ 109 are controlled by a pin clock, i.e., derived clock $CK_1$ 110(*a*), which is derived from a reference clock RCLK 150(*a*). The latches $LAT_2$ 102, $LAT_5$ 105, and $LAT_8$ 108 are controlled by a pin clock $NCK_1$ 110(*b*), which is derived from a reference clock NRCLK 150(*b*). The pin clock $CK_1$ 110(*a*) typically has opposite waveform compared with the pin clock $NCK_{1\ 110}$(*b*). The latches $LAT_6$ 106 and $LAT_7$ 107 are controlled by a pin clock $CK_2$ 120(*a*), which, in this example, is also derived from the reference clock RCLK 150(*a*). A reference clock is a parent clock that has a well defined waveform and can, using digital circuitry, derive several pin clock waveforms, for example, $CK_1$ 110(*a*) and $CK_2$ 120(*a*).

Latches may store input signals when the clocks controlling the latches are high. As discussed above, level triggered latches accept signals at any time when the clock signals are high, while edge triggered latches accept signals only when the edge arrives. The latches shown in FIG. 1 are level triggered latches, i.e., data signals arriving at the latches are stored in the latches and propagate to the output ports only when the clock signals controlling the latches are high. In other words, if the data signals at the input port arrive at the latches before the clock signals controlling the latches, the data signals will stop at the latches; only if the data signals arrive at the latches after the clock signals will the data signals propagate to the output ports. However, the data signals must arrive before the clock signals change from high to low in order to be stored in the latches. The critical path depends on the relationship between the arrival time of data signal and clock signal controlling the latch. If the data signal arrives after the clock signal, the critical path is data to output path.

A signal entering the input port may pass through the output port only if the signal arrives at the output port later than the clock signal on the most critical clock-to-output path. All clock-to-output paths need to be considered. For example, on the timing path $IN_1$-$OUT_1$, the clock-to-output paths to be considered include $CK_1$-$OUT_1$ path passing through the latch $LAT_3$ 103, $NCK_1$-$OUT_1$ path passing through the latches $LAT_2$ 102 and $LAT_3$ 103, and $CK_1$-$OUT_1$ path passing through the latches $LAT_2$ 101, $LAT_2$ 102, and $LAT_3$ 103. On the timing path $IN_2$-$OUT_1$, the clock-to-output paths to be considered include $CK_2$-$OUT_1$ path passing through the latch $LAT_6$ 106, $NCK_1$-$OUT_1$ path passing through the latches $LAT_5$ 105 and $LAT_6$ 106, and $CK_1$-$OUT_1$ path passing through the latches $LAT_4$ 104, $LAT_5$ 105, and $LAT_6$ 106.

In the timing abstraction model, all six clock-to-output paths from above are considered to determine the most critical clock-to-output path for output port $OUT_1$. For example, a signal from the input port $IN_1$ 131 may arrive at the output port $OUT_1$ 141 later than signals from clocks controlling the latches $LAT_1$ 101, $LAT_2$ 102, and $LAT_3$ 103 on the timing path $IN_1$-$OUT_1$, but earlier than signal from a clock controlling the latch $LAT_5$ 105 on the timing path $IN_2$-$OUT_1$. In such case, the data signal from the input port $IN_1$ 131 will not be allowed to pass to the output port $OUT_1$ 141 because the data signal comes later than the most critical clock signal. As a result, the number of paths fed to adjacent blocks are limited, leading to speed-up of the timing analysis and simplification of output from the simulation.

The reference clock that triggers the last latch on a path is important for cycle counting when a signal passes from the output port of one block to the input port and the first latch of the next block. Accordingly, in this example, the important clock on the IN-$OUT_1$ path is the pin clock $CK_1$ 110(*a*), and the important clock on the $IN_2$-$OUT_1$ path is the pin clock $CK_2$ 120(*a*), both are derived from the same reference clock RCLK 150(*a*).

In the timing abstraction model, the clock that controls the dummy latch may be derived from the reference clock that controls the last latch in the modeled circuit, to assure proper cycle counting as the path crosses block boundaries. However, the opening time of the dummy latch is based on the signal arrival at the output port on the most critical clock-to-output path. The clock on the most critical path may be different from the clock controlling the last latch. In the example from above, the clock $NCK_1$ 110(*b*) that controls the latch $LAT_5$ 105 is the most critical clock, derived from the reference clock NRCLK 150(*b*). The clock $CK_2$ 120(*a*) derived from the reference clock RCLK 150(*a*) will control the dummy latch attached to the output port $OUT_1$ 141 in the timing abstraction model. The delay from the clock $CK_2$ 120(*a*) to the dummy latch will be adjusted so that the dummy latch opens at the time when the signal from the clock $NCK_1$ passing latches $LAT_5$ 105 and $LAT_6$ 106 arrives at the output port $OUT_1$ 141.

Figure 2:
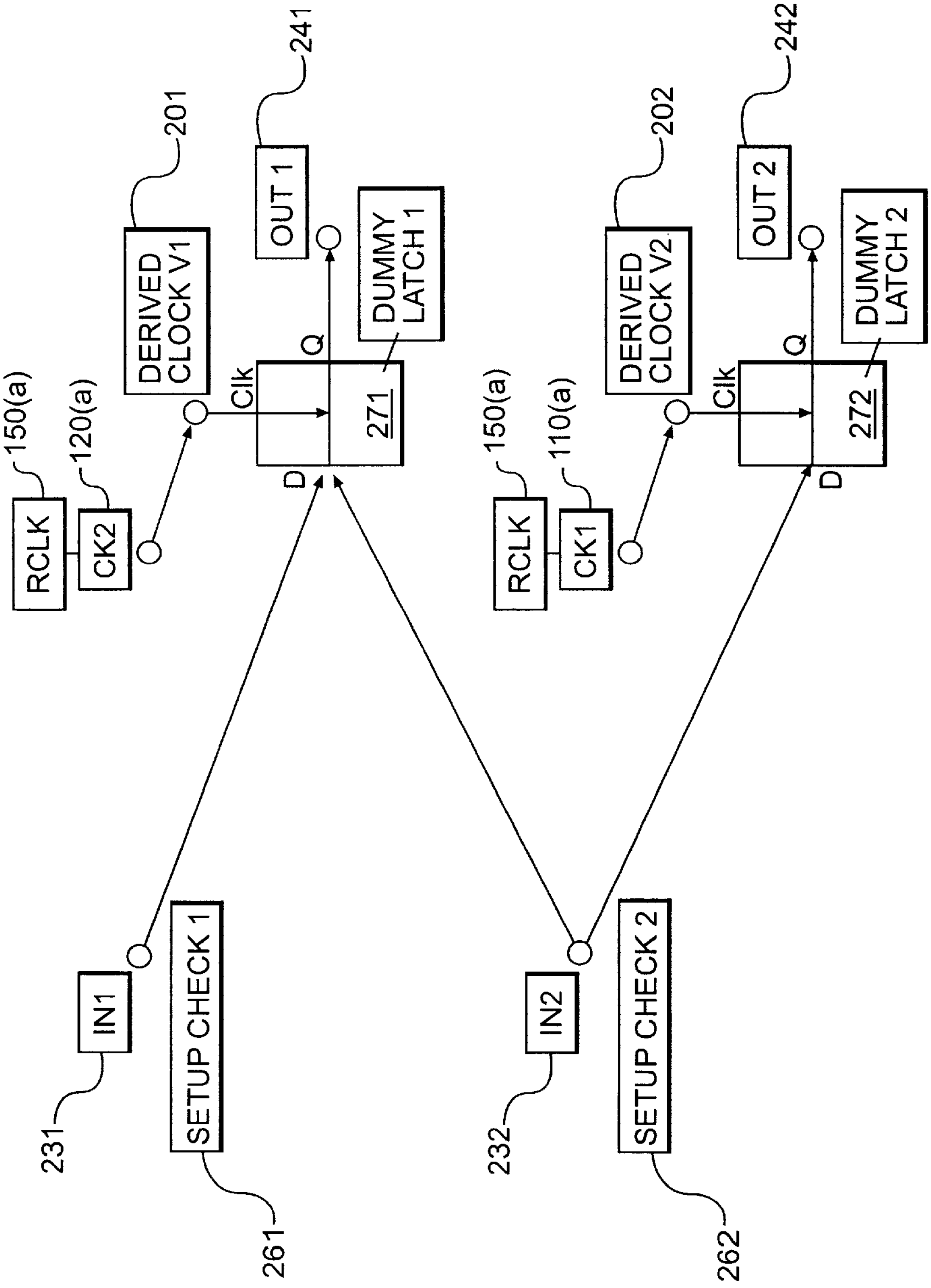
FIG. 2 illustrates an exemplary timing abstraction model generated from the exemplary circuit block in FIG. 1.

FIG. 2 illustrates an exemplary timing abstraction model for the exemplary circuit block shown in FIG. 1. Input ports $IN_1$ 231 and $IN_2$ 232 are the input ports in the timing abstraction model that correspond to the input ports in the modeled circuit in FIG. 1 and output ports $OUT_1$ 241 and $OUT_2$ 242 are the output ports in the timing abstraction model that correspond to the output ports in the modeled circuit in FIG. 1. Setup check nodes 261, 262 are attached to the input ports $IN_1$ 231 and $IN_2$ 232, respectively, and dummy latch nodes 271, 272 are attached to the output ports $OUT_1$ 241 and $OUT_2$ 242, respectively. The signal typically propagates from the input ports $IN_1$ 231 and $IN_2$ 232 of the timing abstraction model through the setup check nodes 261, 262 and the dummy latch nodes 271, 272 to the output ports $OUT_1$ 241 and $OUT_2$ 242.

Two different types of path may converge to each dummy latch node, a data path carrying a data signal and a clock path carrying a clock signal. The dummy latch nodes 271, 272 open only if the data signal on the latch comes after the most critical clock. In this example, two data paths converge to the dummy latch node 271, one from the input port $IN_1$ 231, the other from the input port $IN_2$ 232. The dummy latch nodes 271,272 are controlled by derived clock nodes $V_1$ 201, $V_2$ 202, respectively. The clock node $V_1$ 201 may be derived from either the pin clock $CK_1$ 110(*a*) or $CK_2$ 120(*a*), both are derived from the reference clock RCLK 150(*a*). Since the same parent reference clock is controlling the last latches on both paths converging to output port $OUT_1$ in the modeled circuit (see latches $LAT_3$ 103 and $LAT_6$ 106 in FIG. 1), it is not necessary to split the dummy latch node 271 in this example. Since the pin clock $CK_2$ 120(*a*) is on the most critical clock-to-output path in this example, the clock node 201 is derived from $CK_2$ 120(*a*). The clock node $V_2$ 202 is derived from the pin clock $CK_1$ 110(*a*), which is derived from the reference clock RCLK 150(*a*). Delays from $CK_2$ to derived clock node $V_1$ 201 and from $CK_1$ to derived clock node $V_2$ 202 may be adjusted so that the dummy latch nodes 271, 272, respectively, open at valid times, i.e., at times when signals on the most critical clock-to-output paths reach the output ports $OUT_1$ 241 and $OUT_2$ 242, respectively. The dummy latch nodes close at times of the latest data signal arrival at the respective output ports when the stimulus for each input port is set to the required time, i.e., the latest time signal can arrive at the port before any setup violation would occur in the modeled circuit.

For example, when the signal arrives at the input port $IN_2$ 232, the signal passes transparently through the dummy latch node 271 while the signal from the derived clock node $V_1$ 201 is high. Alternatively, the signal passes transparently through the dummy latch node 272 while the signal from the derived clock node $V_2$ 202 is high.

If an input-to-output path is a multi-cycle path, a time arc (or a connectivity network) may be assigned a multi-cycle path attribute with proper cycle count. The time arc connects a setup check node attached to an input port with a corresponding dummy latch attached to an output port. Applications of the multi-cycle path attribute may depend on the STA tool into which the timing abstraction model is imported. In the exemplary circuit from FIG. 1, the paths $IN_1$-$OUT_1$, $IN_2$-$OUT_1$, and $IN_2$-$OUT_2$ are two-cycle paths because the paths pass through three latches controlled by the reference clocks RCLK 150(*a*), NRCLK 150(*b*), and RCLK 150(*a*), respectively. If the timing abstraction model from FIG. 2 is represented, for example, by a Pathmill Graybox, multi_cycle_path configuration commands with number of cycles set to two may be used on the time arcs, i.e., on the setup check node 261—dummy latch node 271, setup check node 262—dummy latch node 271 and setup check node 262—dummy latch node 272 time arcs. Similarly, if the clock-to-output path is a multi-cycle path, a corresponding time arc entering a dummy latch node from a clock side may be assigned a multi-cycle path attribute.

Four types of paths may appear in the STA analysis: 1. input port to setup check paths, i.e., from the input ports 231, 232 to the setup check nodes 261, 262, respectively; 2. input port to dummy latch paths, i.e., in the exemplary circuit from FIG. 1, paths from the input port 231 to the dummy latch node 271, from the input port 232 to the dummy latch node 271, and from the input port 232 to the dummy latch node 272; 3. input to output transparent paths that will appear only if the data signals arrive at the dummy latch nodes 271, 272 after the most critical clock signals; 4. pin clock to output port paths, i.e., from the pin clocks 120(*a*), 110(*a*) to the output ports 241, 242, respectively.

In some cases, the pin clock controlling the first latch on an input-to-output path starting at a given input port in the modeled circuit may be derived from a different reference clock or a different reference clock level than the pin clock controlling the last latch along the same path. In such case, the setup check node attached to an input port in the timing abstraction model may need to be replaced by a latch node, denoted as a setup check latch to distinguish from the dummy latch nodes attached to the output ports. All input-to-output paths from the given input port may pass through the setup check latch. While the setup check is associated with only the closing clock edge with respect to which the setup time is checked, the setup check latch is also associated with an opening clock edge. The clock controlling the setup check latch may be derived from the same reference clock that controls the first latch on the input-to-output path in the modeled circuit, thus assuring correct cycle advancement on the input-to-output path in the timing abstraction model. The cycle advancement in the timing abstraction model is determined by a cycle advancement on block boundaries plus a cycle advancement inside the timing abstraction model.

The cycle advancement on the block boundaries may be assured to be correct since: 1) the clock edge of the setup check, i.e., the closing edge of the setup check latch, is derived from the same reference clock edge as the closing edge of the first latch on the path in the modeled circuit; and 2) the opening edge of the dummy latch node is derived from the same reference clock edge as the opening edge of the last latch on the path in the modeled circuit. The cycle advancement inside the timing abstraction model is determined by the opening edge of the setup check latch (a driver edge), the closing edge of the dummy latch node (a receiver edge), and the multi-cycle path commands applied on the setup check latch—dummy latch node time arcs, as described above. Replacing the setup check node by the setup check latch will assure proper cycle advancement inside the timing abstraction model in case when the first latch and the last latch on the path in the modeled circuit are controlled by different reference clocks or reference clock levels.

The setup check latch may have a controlling clock that closes at the required time. The setup check latch opens early enough so that data signals that would pass the setup check latch at an opening time will arrive at the output ports before the most critical clock-to-output paths. As long as such condition is met, the opening time may be arbitrary. No clock-to-output path passes the setup check latch.

Figure 3:
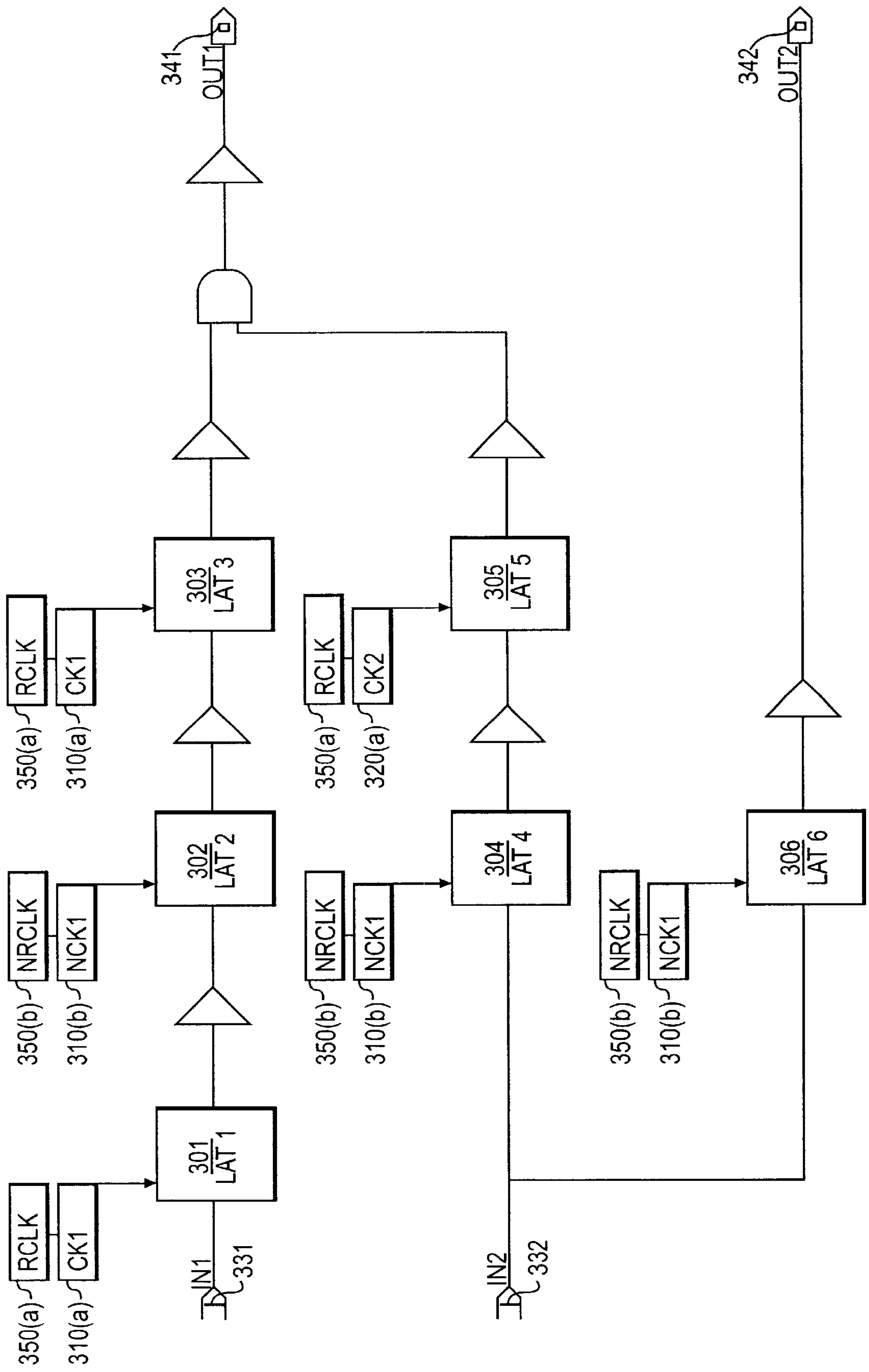
FIG. 3 is an exemplary circuit block with two input ports, two output ports, and three transparent paths IN1-OUT1, IN2-OUT1, and IN2-OUT2, wherein the first and the last sequential elements on the transparent path IN2-OUT1 are controlled by different reference clocks.

FIG. 3 shows an exemplary circuit block where a first latch along the input-to-output path is controlled by a different reference clock than a last latch along the same path. The circuit is similar to the circuit from FIG. 1 in that the circuit has two input ports $IN_1$ 331 and $IN_2$ 332, two output ports $OUT_1$ 341 and $OUT_2$ 342, and timing paths $IN_1$-$OUT_1$, $IN_2$-$OUT_1$, and $IN_2$-$OUT_2$. However, the circuit in FIG. 3 has only two latches $LAT_4$ 304 and $LAT_5$ 305 along the $IN_2$-$OUT_1$ timing path. The latch $LAT_4$ 304 is controlled by a pin clock $NCK_1$ 310(*b*) that is derived from a reference clock NRCLK 350(*b*). The latch $LAT_5$ 305 is controlled by a pin clock $CK_2$ 320(*a*) that is derived from a reference clock RCLK 350(*a*).

Figure 4:
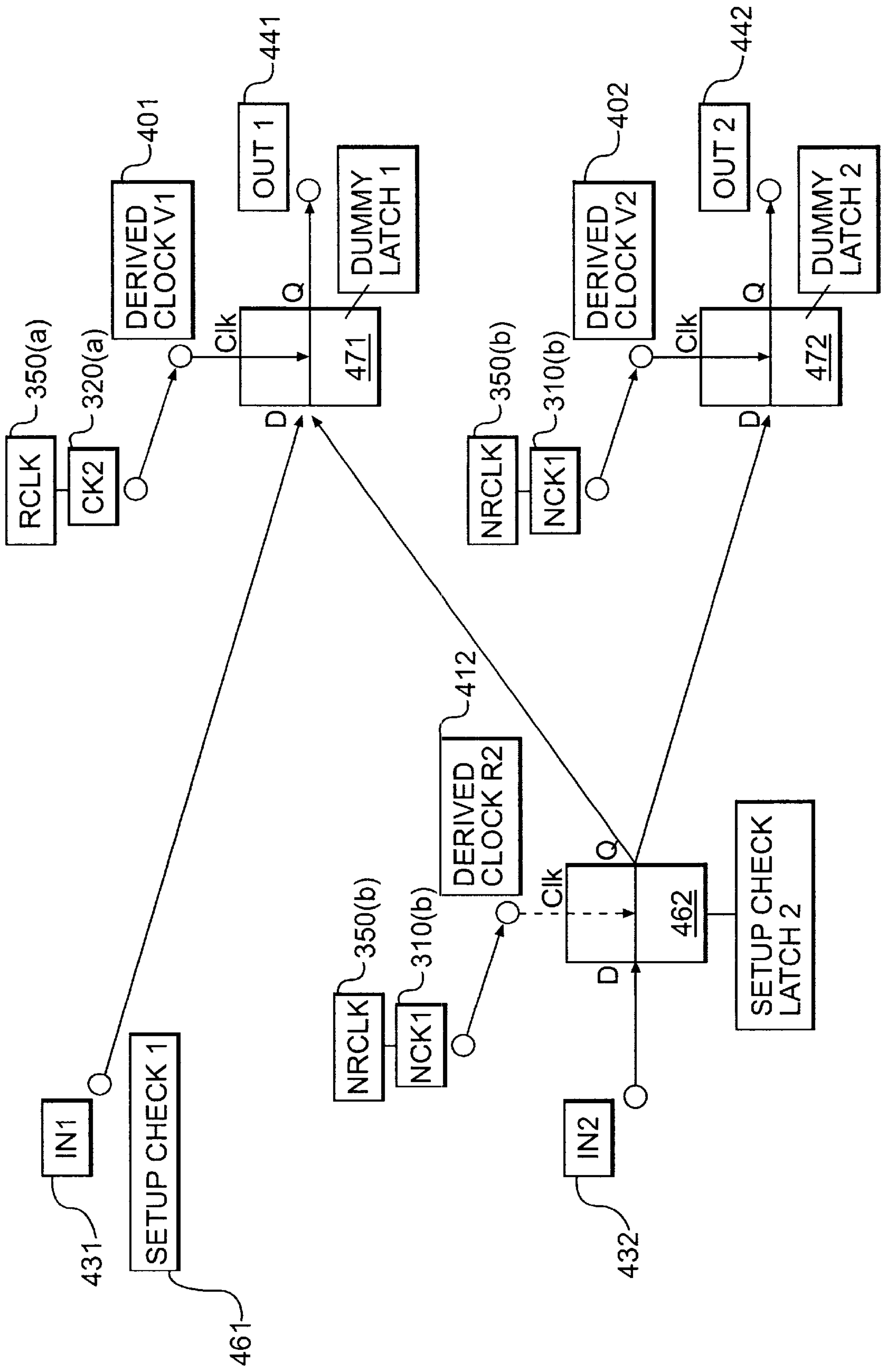
FIG. 4 illustrates an exemplary timing abstraction model generated from the exemplary circuit block in FIG. 3.

FIG. 4 illustrates an exemplary timing abstraction model for the exemplary circuit block shown in FIG. 3. The timing abstraction model is similar to the timing abstraction model shown in FIG. 2, except that the setup check node attached to input port $IN_2$ 432 is replaced by a setup check latch 462. Since the same parent reference clock is controlling the first latches on both paths starting from the input port $IN_2$ 332 in the modeled circuit (see latches $LAT_4$ 304 and $LAT_6$ 306 in FIG. 3), it is not necessary to split the setup check latch 462 in this example. The setup check latch 462 is controlled by a derived clock node $R_2$ 412. The clock node $R_2$ 412 is derived from the pin clock $NCK_1$ 310(*b*), which is derived from the reference clock NRCLK 350(*b*).

The delay from the pin clock $CK_2$ 320(*a*) to the derived clock node $R_2$ 412 may be adjusted so that the setup check latch node 462 closes at the required time, i.e., at time when setup violation would occur on the most critical path from the input port $IN_2$ 332 in the modeled circuit. The setup check latch 462 opens early enough so that data signals that would pass the setup check latch 462 at the opening time arrive at the output ports 441, 442 before the most critical clock-to-output paths.

Figure 5:
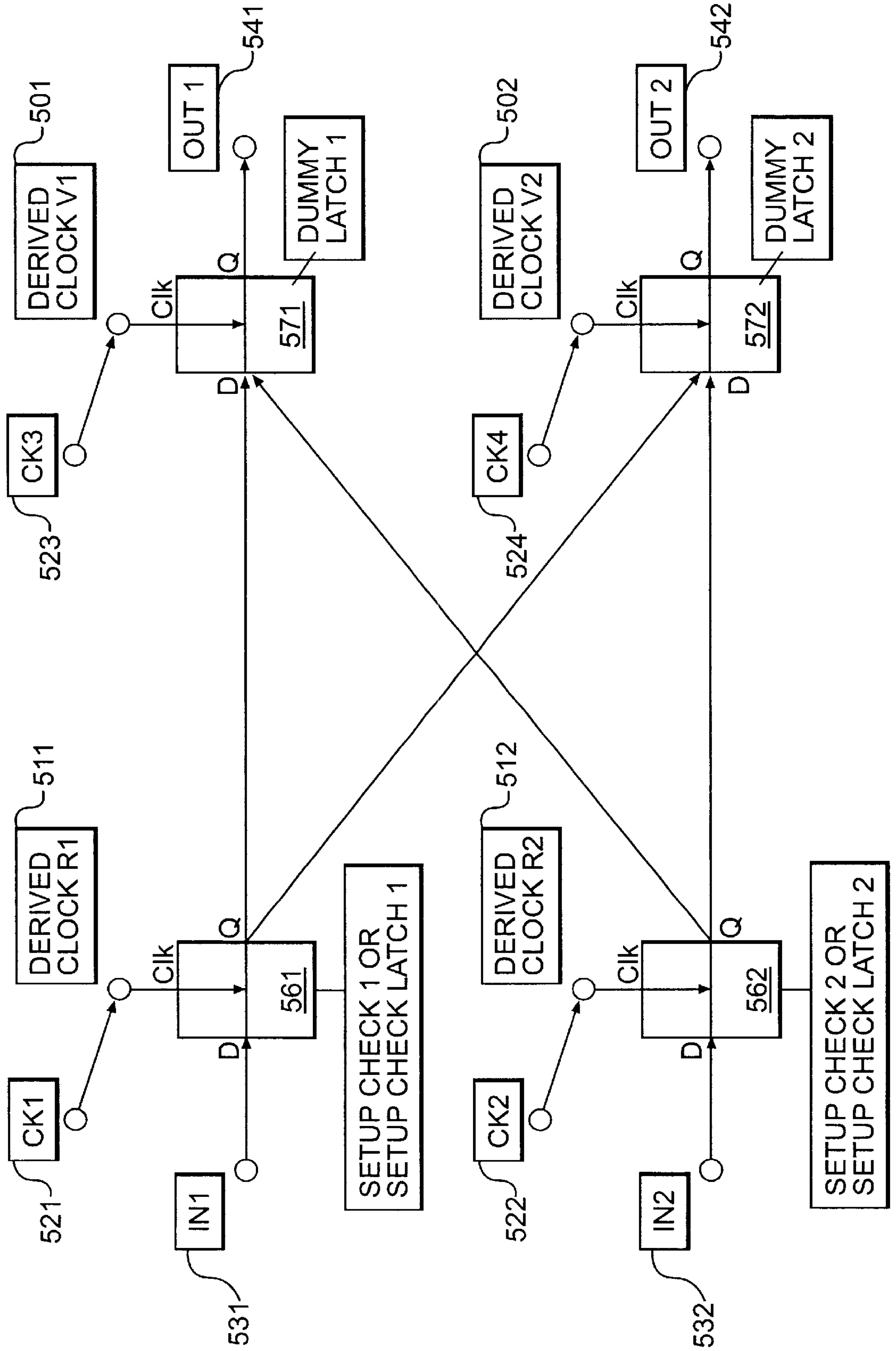
FIG. 5 illustrates a general format of the exemplary timing abstraction model, which is generated from another exemplary circuit block with two input ports, two output ports, and transparent paths between each input and output port.

FIG. 5 is an exemplary suggested format for the minimal level sensitive timing abstraction model. Signals propagate from input ports $IN_1$ 531 and $IN_2$ 532 to output ports $OUT_1$ 541 and $OUT_2$ 542 through two setup check nodes (or latches) 561, 562 and two dummy latch nodes 571, 572.

The setup check nodes (or latches) 561, 562 are controlled by derived clock nodes $R_1$ 511, $R_2$ 512, respectively. The clock node $R_1$ 511 may be derived from a pin clock $CK_1$ 521, whereas the clock node $R_2$ 512 is derived from a pin clock $CK_2$ 522. The pin clocks $CK_1$ 521 and $CK_2$ 522 may be derived from the same or different reference clocks (not shown).

Likewise, the dummy latch nodes 571, 572 are controlled by derived clock nodes $V_1$ 501, $V_2$ 502, respectively. The clock node $V_1$ 501 may be derived from a pin clock $CK_3$ 523, whereas the clock node $V_2$ 502 is derived from a pin clock $CK_4$ 524. Similarly, the pin clocks $CK_3$ 523 and $CK_4$ 524 may be derived from the same or different reference clocks (not shown).

In some special cases, more than one clocked element may be needed in the timing abstraction model for input ports and for output ports. For example, if an output port in a modeled circuit is connected through a multiple clocked elements that are controlled by the same reference clock and the same clock active level, as described above with respect to FIGS. 1–4, only one dummy latch node may be needed in the timing abstraction model. However, if the multiple clocked elements are controlled by different reference clocks or different clock active levels, and if the clocked elements are the last sequential elements connected to the output port, the output port in the timing abstraction model may need multiple dummy latch nodes, one attached to each reference clock or clock active level. The splitting is to assure correct advancing of a cycle count as the signal propagates through the timing abstraction model boundaries. Similarly, the same rational applies to clocked elements at the input ports, splitting into multiple setup check nodes or setup check latches. Even if these special cases may occur frequently in medium or large modeled circuits, with several latches along input-to-output paths, the number of clocked elements in the timing abstraction model may still be significantly smaller than in other currently available level sensitive timing models.

Figure 6B:
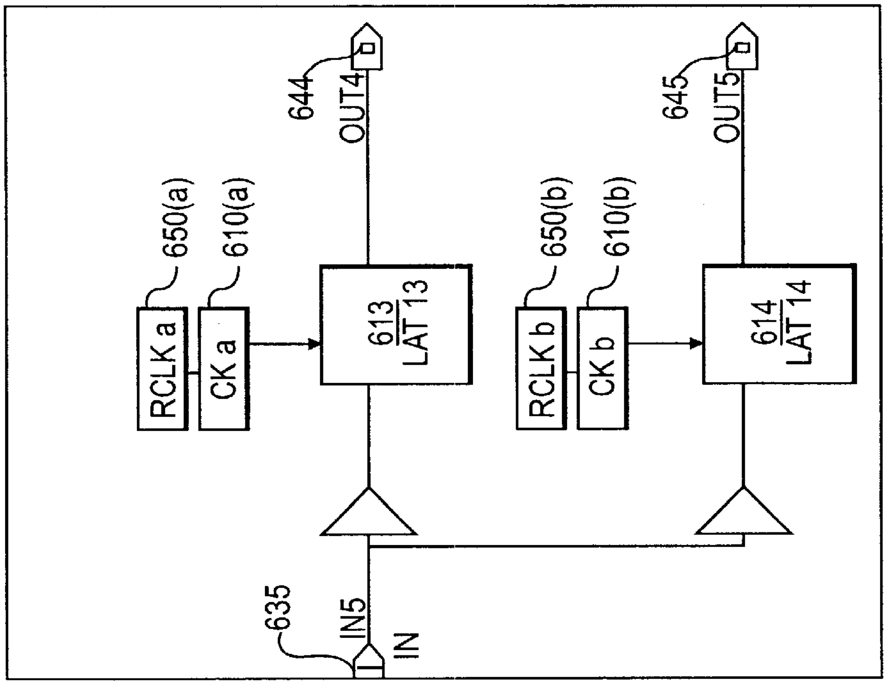
FIGS. 6(*a*) and 6(*b*) are exemplary circuit blocks with multiple reference clocks at block boundaries.
Figure 6A:
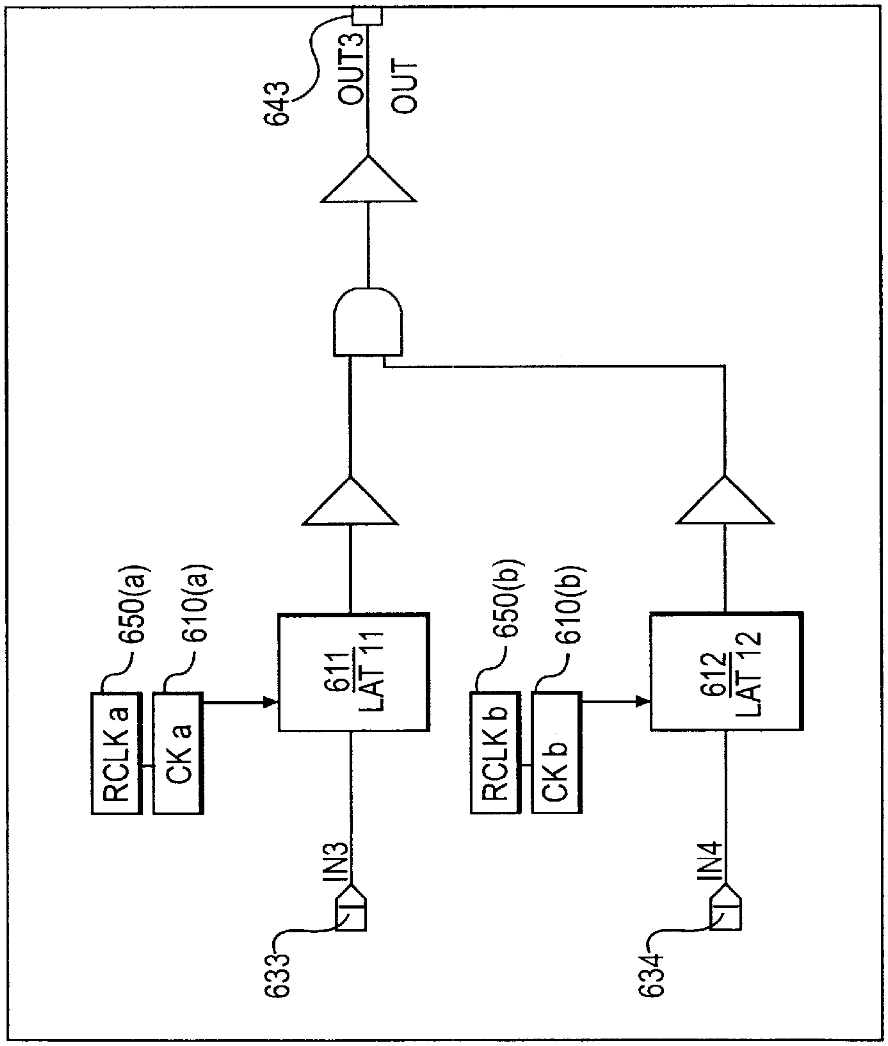

FIGS. 6(*a*) and 6(*b*) show exemplary circuits with multiple reference clocks at block boundaries. Referring to FIG. 6(*a*), an exemplary circuit block includes input ports $IN_3$ 633 and $IN_4$ 634, an output port $OUT_3$ 643, and timing paths $IN_3$-$OUT_3$ and $IN_4$-$OUT_3$. Two latches exist in the circuit block, i.e., $LAT_{11}$ 611 on the $IN_3$-$OUT_3$ path and $LAT_{12}$ 612 on the $IN_4$-$OUT_3$ path. The latch $LAT_{11}$ 611 is controlled by a pin clock $CK\_\_a$ 610 (*a*), which is derived from a reference clock $RCLK\_\_a$ 650(*a*). The latch $LAT_{12}$ 612 is controlled by a pin clock $CK\_\_b$ 610(*b*), which is derived from a different reference clock $RCLK\_\_b$ 650(*b*).

Referring to FIG. 6(*b*), the exemplary circuit block includes an input port $IN_5$ 635, output ports $OUT_4$ 644 and $OUT_5$ 645, and timing paths $IN_5$-$OUT_4$ and $IN_5$-$OUT_5$. Likewise, two latches exist in the circuit block, i.e., $LAT_{13}$ 613 on the $IN_5$-$OUT_4$ path and $LAT_{14}$ 614 on the $IN_5$-$OUT_5$ path. Similarly, the latch $LAT_{13}$ 613 is controlled by the pin clock $CK\_\_a$ 610(*a*), which is derived from the reference clock $RCLK\_\_a$ 650(*a*), and the latch $LAT_{14}$ 614 is controlled by the clock pin $CK\_\_b$ 610(*b*), which is derived from the different reference clock $RCLK\_\_b$ 650(*b*).

Figures 7A, 7B:
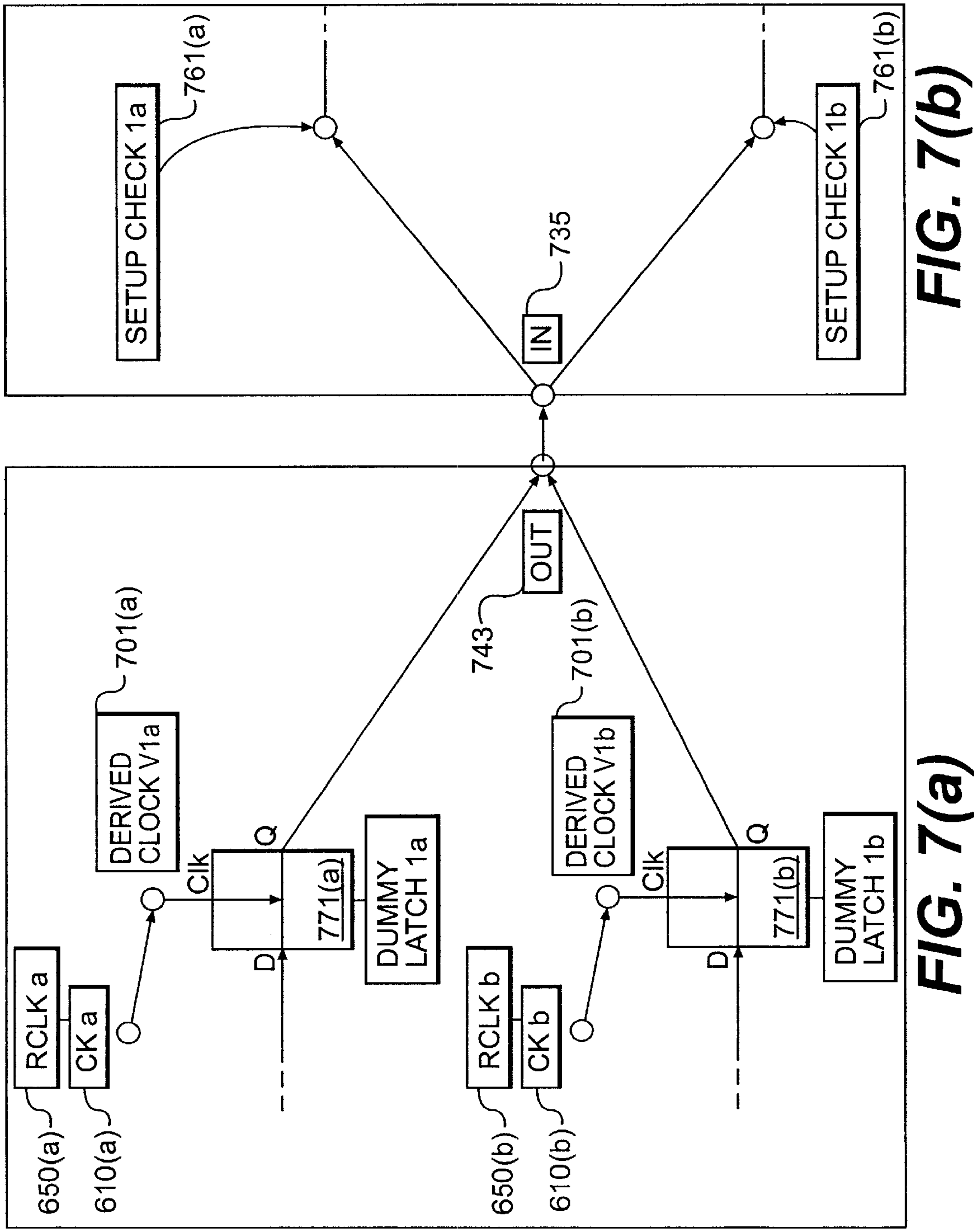
FIGS. 7(*a*) and 7(*b*) illustrate exemplary timing abstraction models generated from the exemplary circuit blocks in FIGS. 6(*a*) and 6(*b*)

FIG. 7(*a*) and FIG. 7(*b*) illustrate an exemplary timing abstraction model for representing the circuit with multiple reference clocks as shown in FIGS. 6(*a*) and 6(*b*). Only paths belonging to one reference clock may converge to one dummy latch node. Referring to FIG. 7(*a*), there are two different reference clocks, i.e., $RCLK\_\_a$ 650(*a*) and $RCLK\_\_b$ 650(*b*), in the circuit shown in FIG. 6(*a*). Therefore, to adequately represent the circuit block, two dummy latch nodes, i.e., dummy latch node 771 (*a*) and dummy latch node 771(*b*), need to be attached to an output port 743, which corresponds to the output port $OUT_3$ 643 of the modeled circuit. In other words, splitting occurs at the output port. Similarly, FIG. 7(*b*) illustrates splitting at the input port, where two different reference clocks, i.e., $RCLK\_\_a$ 650(*a*) and $RCLK\_\_b$ 650(*b*), are involved. Two setup check nodes, i.e., setup check node 761(*a*) and setup check node 761(*b*), are attached to an input port 735, which corresponds to the input port $IN_5$ 635 of the modeled circuit in FIG. 6(*b*).

In summary, splitting of dummy latch nodes at the output port may be required if multiple paths controlled by different reference clocks converge to one output port. In other words, only paths controlled by the same reference clock can pass through one dummy latch node. The same applies to the input port, if the multiple paths diverging from an input port are controlled by different reference clocks, there may be splitting of setup check nodes. However, if only different pin clocks that are derived from the same reference clock are involved, no splitting is required.

Figure 8:
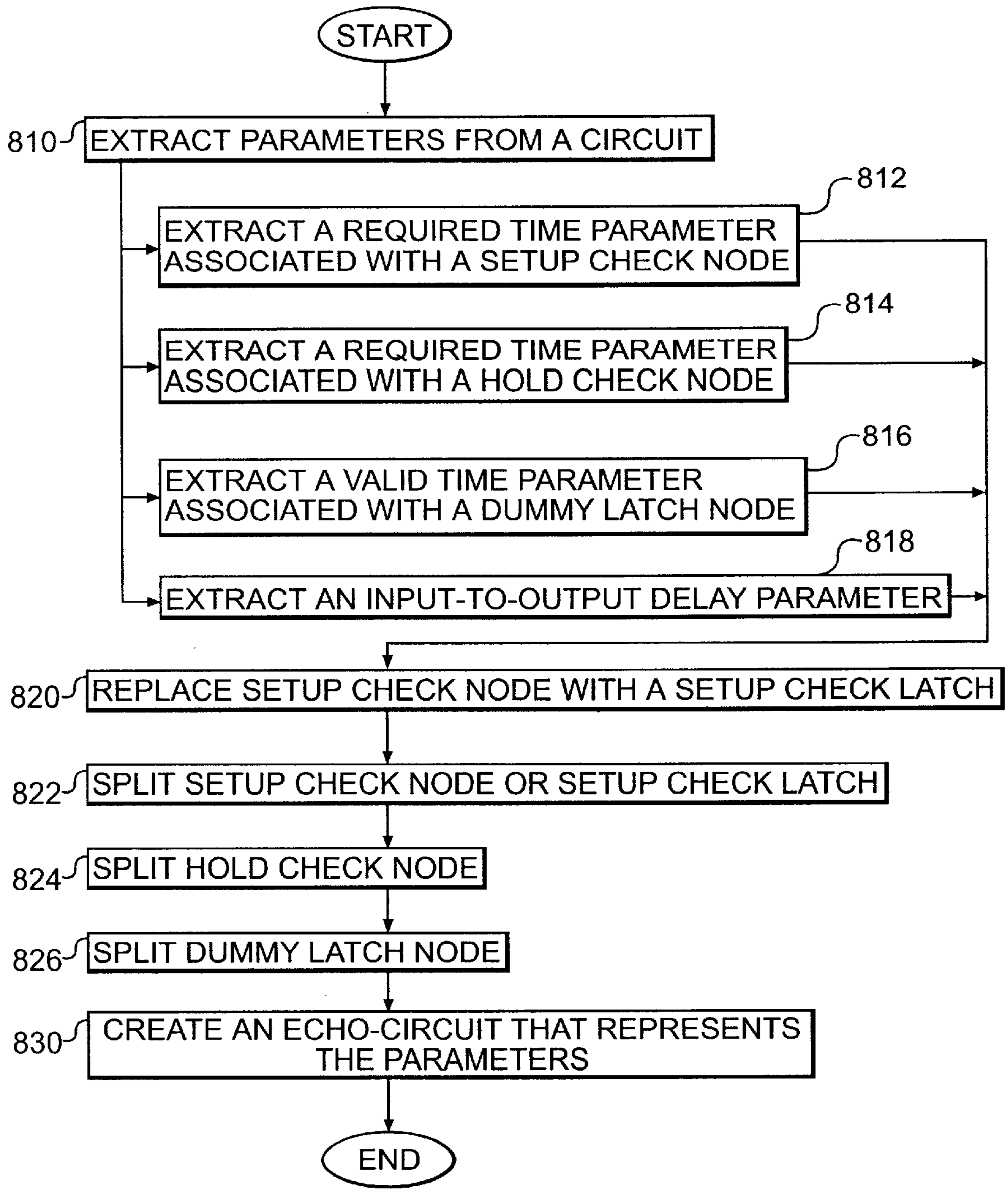
FIG. 8 is a flow chart illustrating an exemplary method for modeling a circuit block with a minimal level sensitive timing abstraction model.

FIG. 8 is a flow chart illustrating an exemplary method for modeling a circuit block with a minimal level sensitive timing abstraction model. First, parameters may be extracted from the circuit block that includes sequential elements, such as latches or domino logics, controlled by clock elements, step 810. The parameters to be extracted may include a required time parameter associated with a setup check node, step 812, a required time parameter associated with a hold check node, step 814, a valid time parameter associated with a dummy latch node, step 816, or an input-to-output delay parameter, step 818.

If the clock elements controlling a first and a last sequential elements on some transparent path from an input port in the circuit block are derived from different reference clocks, the setup check node may be replaced by a setup check latch, step 820. If the clock elements controlling first sequential elements on different paths from an input port in the circuit block are derived from different reference clocks, the setup check node (or latch) and the hold check node may need to be split, steps 822 and 824. Likewise, if the clock elements controlling last sequential elements on different paths to an output port in the circuit block are derived from different reference clocks, the dummy latch node may need to be split, step 826.

Next, an echo-circuit, i.e., a timing abstraction model, may be created to represent the parameters, step 830. The echo-circuit may enable a signal to propagate from an input port to an output port only if the signal arrives at the output port later than a clock signal from the most critical clock element controlling the output port.

Figure 9:
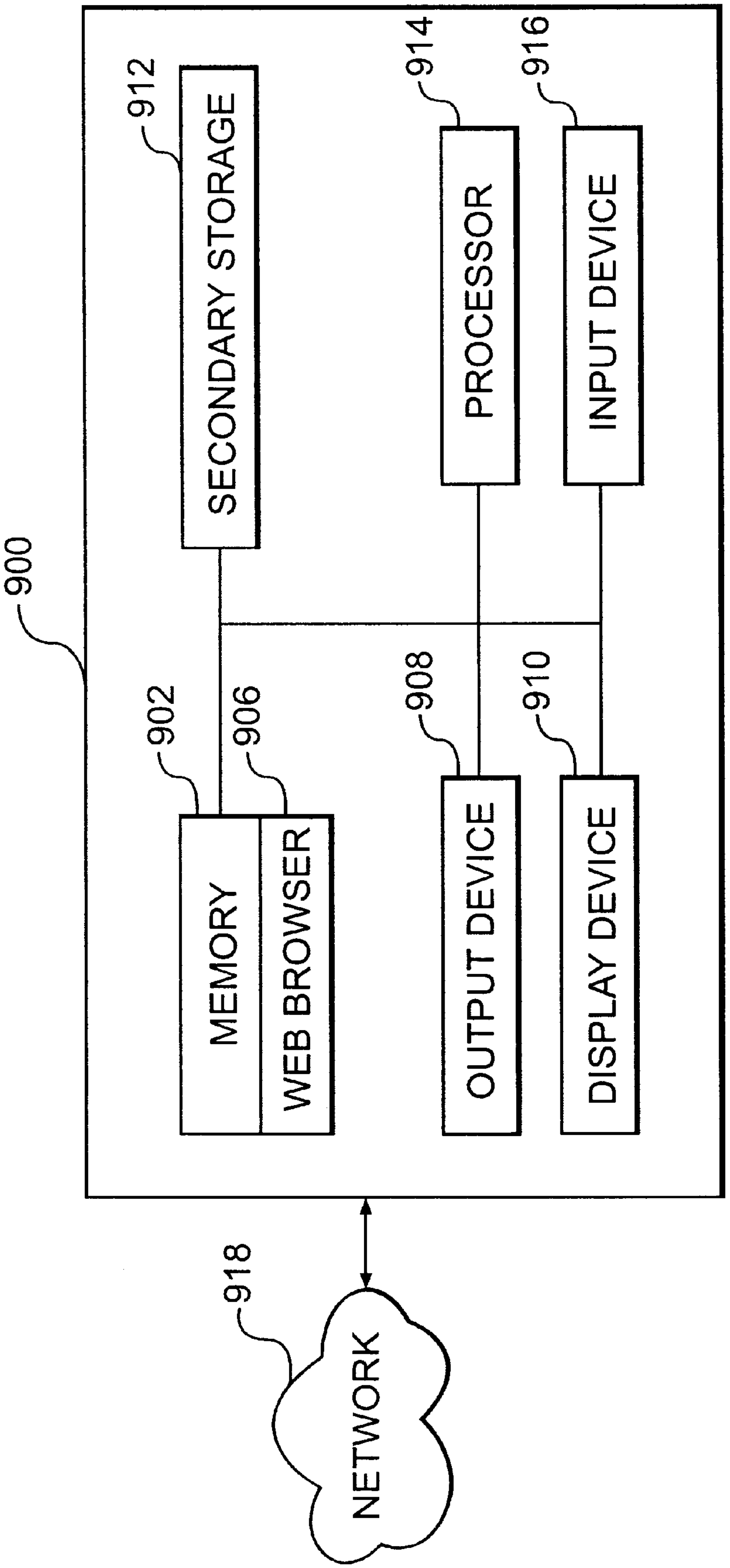
FIG. 9 illustrates exemplary hardware components of a computer that may be used to in connection with the minimal level sensitive timing abstraction model.

FIG. 9 illustrates exemplary hardware components of a computer 900 that may be used to in connection with the minimal level sensitive timing abstraction model. The computer 900 typically includes a memory 902, a secondary storage device 912, a processor 914, an input device 916, a display device 910, and an output device 908.

The memory 902 may include random access memory (RAM) or similar types of memory. The secondary storage device 912 may include a hard disk drive, floppy disk drive, CD-ROM drive, or other types of non-volatile data storage, and may correspond with various databases or other resources. The processor 914 may execute information stored in the memory 902 or the secondary storage 912. The input device 916 may include any device for entering data into the computer 900, such as a keyboard, key pad, cursor-control device, touch-screen (possibly with a stylus), or microphone. The display device 910 may include any type of device for presenting visual image, such as, for example, a computer monitor, flat-screen display, or display panel. The output device 908 may include any type of device for presenting data in hard copy format, such as a printer, and other types of output devices include speakers or any device for providing data in audio form. The computer 900 can possibly include multiple input devices, output devices, and display devices.

Although the computer 900 is depicted with various components, one skilled in the art will appreciate that the computer 900 can contain additional or different components. In addition, although aspects of an implementation consistent with the present invention are described as being stored in memory, one skilled in the art will appreciate that these aspects can also be stored on or read from other types of computer program products or computer-readable media, such as secondary storage devices, including hard disks, floppy disks, or CD-ROM; a carrier wave from the Internet or other network; or other forms of RAM or ROM. The computer-readable media may include instructions for controlling the computer 900 to perform a particular method.

While the minimal level sensitive timing abstraction model has been described in connection with an exemplary embodiment, it will be understood that many modifications in light of these teachings will be readily apparent to those skilled in the art, and this application is intended to cover any variations thereof.

What is claimed is:

1. A method for modeling a circuit block with a minimal level sensitive timing abstraction model, comprising:

modeling a circuit block by extracting a plurality of parameters from a circuit that includes sequential elements controlled by internally generated clock signals, wherein the extracting step comprises:

for each input port associated with an input in the circuit, extracting a required time parameter associated with a check node;

for each output port associated with an output in the circuit, extracting a valid time parameter associated with a dummy latch node, wherein the valid time parameter traces a latest clock signal arriving at the output port, and wherein the dummy latch node is controlled by an internally generated clock signal that becomes active when the latest clock signal from the circuit arrives at the output port; and extracting an input-to-output delay parameter that represents a time delay a signal passes from the input port to the output port, wherein the dummy latch node enables the signal to propagate from the input port to the output port only if the signal arrives at the output port later than a latest clock signal from any pin clock signal controlling the dummy latch node; and creating an echo-circuit that represents the plurality of parameters, wherein the echo-circuit is stimulus independent, port-based, has no internal latch nodes, and is used in any static timing analysis (STA) tools.

2. The method of claim 1, wherein the extracting the required time parameter step includes extracting the required time parameter associated with a setup check node.

3. The method of claim 2, wherein if the internally generated clock signals controlling a first and a last sequential elements on some transparent path from the input in the circuit are derived from different reference clocks, further comprising replacing the setup check node by a setup check latch.

4. The method of claim 1, wherein the extracting the required time parameter step includes extracting the required time parameter associated with a hold check node.

5. The method of claim 1, wherein if the internally generated clock signals controlling first sequential elements on different paths from the input in the circuit are derived from different reference clocks, further comprising, splitting the check node.

6. The method of claim 1, wherein if the internally generated clock signals controlling last sequential elements on different paths to the output in the circuit are derived from different reference clocks, further comprising splitting the dummy latch node.

7. The method of claim 1, further comprising dividing the circuit into circuit blocks.

8. A minimal level sensitive timing abstraction model comprising:

an input port that represents an input in a circuit, wherein the circuit includes sequential elements controlled by internally generated clock signals;

an output port that represents an output in the circuit;

a check node connected to the input port, wherein the check node establishes a required time; and a dummy latch node connected to the output port, wherein the dummy latch node is controlled by an internally generated clock signal that becomes active when a latest clock signal from the circuit arrives at the output port, wherein the dummy latch node enables a signal to propagate from the input port to the output port only if the signal arrives at the output port later than a latest clock signal from any pin clock signal controlling the dummy latch node, and wherein the timing abstraction model is stimulus independent, port-based, and has no internal latch nodes, and models a circuit block by extracting a plurality of parameters from said circuit that includes sequential elements controlled by internally generated clock signals.

9. The minimal level sensitive timing abstraction model of claim 8, wherein the check node is a setup check node.

10. The minimal level sensitive timing abstraction model of claim 9, wherein the setup check node is replaced by a setup check latch if the internally generated clock signals controlling a first and a last sequential elements on some transparent path from the input in the circuit are derived from different reference clocks.

11. The minimal level sensitive timing abstraction model of claim 8, wherein the check node is a hold check node.

12. The minimal level sensitive timing abstraction model of claim 8, wherein the check node is split if the internally generated clock signals controlling first sequential elements on different paths from the input in the circuit are derived from different reference clocks.

13. The minimal level sensitive timing abstraction model of claim 8, wherein the dummy latch node is split if the internally generated clock signals controlling last sequential elements on different paths to the output in the circuit are derived from different reference clocks.

14. A computer readable medium providing instructions for modeling a circuit block with a minimal level sensitive timing abstraction model, the instructions comprising:

modeling a circuit block by extracting a plurality of parameters from a circuit that includes sequential elements controlled by internally generated clock signals, wherein the extracting step comprises:

for each input port associated with an input in the circuit, extracting a required time parameter associated with a check node;

for each output port associated with an output in the circuit, extracting a valid time parameter associated with a dummy latch node, wherein the valid time parameter traces a latest clock signal arriving at the output port, and wherein the dummy latch node is controlled by an internally generated clock signal that becomes active when the latest clock signal from the circuit arrives at the output port; and extracting an input-to-output delay parameter that represents a time delay a signal passes from the input port to the output port, wherein the dummy latch node enables the signal to propagate from the input port to the output port only if the signal arrives at the output port later than a latest clock signal from any pin clock signal controlling the dummy latch node; and creating an echo-circuit that represents the plurality of parameters, wherein the echo-circuit is stimulus independent, port-based, has no internal latch nodes, and is used in any static timing analysis (STA) tools.

15. The computer readable medium of claim 14, wherein the instructions for extracting the required time parameter step includes extracting the required time parameter associated with a setup check node.

16. The computer readable medium of claim 15, wherein if the internally generated clock signals controlling a first and a last sequential element on some transparent path from the input in the circuit are derived from different reference clocks, further comprising instructions for replacing the setup check node by a setup check latch.

17. The computer readable medium of claim 14, wherein the instructions for extracting the required time parameter step includes extracting the required time parameter associated with a hold check node.

18. The computer readable medium of claim 14, wherein if the internally generated clock signals controlling first sequential elements on different paths from the input in the circuit are derived from different reference clocks, further comprising instructions for splitting the check node.

19. The computer readable medium of claim 14, wherein if the internally generated clock signals controlling last sequential elements on different paths to the output in the circuit are derived from different reference clocks, further comprising instructions for splitting the dummy latch node.

* * * * *